United States Patent
Polignano et al.

(10) Patent No.: US 6,197,606 B1
(45) Date of Patent: *Mar. 6, 2001

(54) DETERMINATION OF THE THICKNESS OF A DENUDED ZONE IN A SILICON WAFER

(75) Inventors: Maria Luisa Polignano, Cambiago; Marzio Brambilla, Robbiate; Francesco Cazzaniga, Seveso; Giuseppe Pavia, Brescia; Federica Zanderigo, Padua, all of (IT)

(73) Assignee: STMicroelectronics S.r.l., Agrate Brianza (IT)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/108,439

(22) Filed: Jul. 1, 1998

(30) Foreign Application Priority Data

Jul. 15, 1997 (EP) .................................................. 97830354

(51) Int. Cl.[7] .................................................. H01L 21/66

(52) U.S. Cl. .............................................................. 438/17

(58) Field of Search .............................. 438/17, FOR 142

(56) References Cited

U.S. PATENT DOCUMENTS 5,272,342   12/1993   Kotani .

FOREIGN PATENT DOCUMENTS 0 668 613 A1   2/1994   (EP) .............................. H01L/21/66

OTHER PUBLICATIONS

Impurity Diffusion and Gettering in Silicon Symposium, Boston, Massachusets, USA pp. Nov. 27–30, 1984, H.J. Rath, et al., "Characterization of Denuded Zones in Silicon Wafers," pp. 193–198, Nov. 1984.*

Patent Abstract of Japan, vol. 017, No. 657, Dec. 6, 1993 and JP 05 218166A (Kawasaki Steel Corp.), Aug. 27, 1993.

Patent Abstract of Japan, vol. 096, No. 007, Jul. 31, 1996 and JP 08 062122A (Komatsu Electron Metals Co., Ltd.), Mar. 8, 1996.

Impurity Diffusion and Gettering in Silicon Symposium, Boston, Massachussetts, USA, pp. Nov. 27–30, 1984, H.J. Rath, et al., "*Characterization of Denuded Zones in Silicon Wafers*," pp. 193–198.

* cited by examiner

Primary Examiner—George Fourson
Assistant Examiner—Barbara Elizabeth Abbott
(74) Attorney, Agent, or Firm—Theodore E. Galanthay; Allen, Dyer, Doppelt, Milbrath & Gilchrist, P.A.

(57) ABSTRACT

The depth of a denuded layer with respect to a relatively defective bulk region of a monocrystalline semiconductor wafer is estimated in a nondestructive way. The depth is determined by measuring the lifetime or diffusion length of injected excess minority charge carriers on a surface of the wafer having such a denuded layer and on a different portion of the surface of the wafer from where the denuded layer has been previously stripped-off by lapping and/or etching. The depth is calculated through a best-fit procedure or through numerical processing of the measurement results on the basis of the diffusion equations of excess minority carriers.

23 Claims, 6 Drawing Sheets

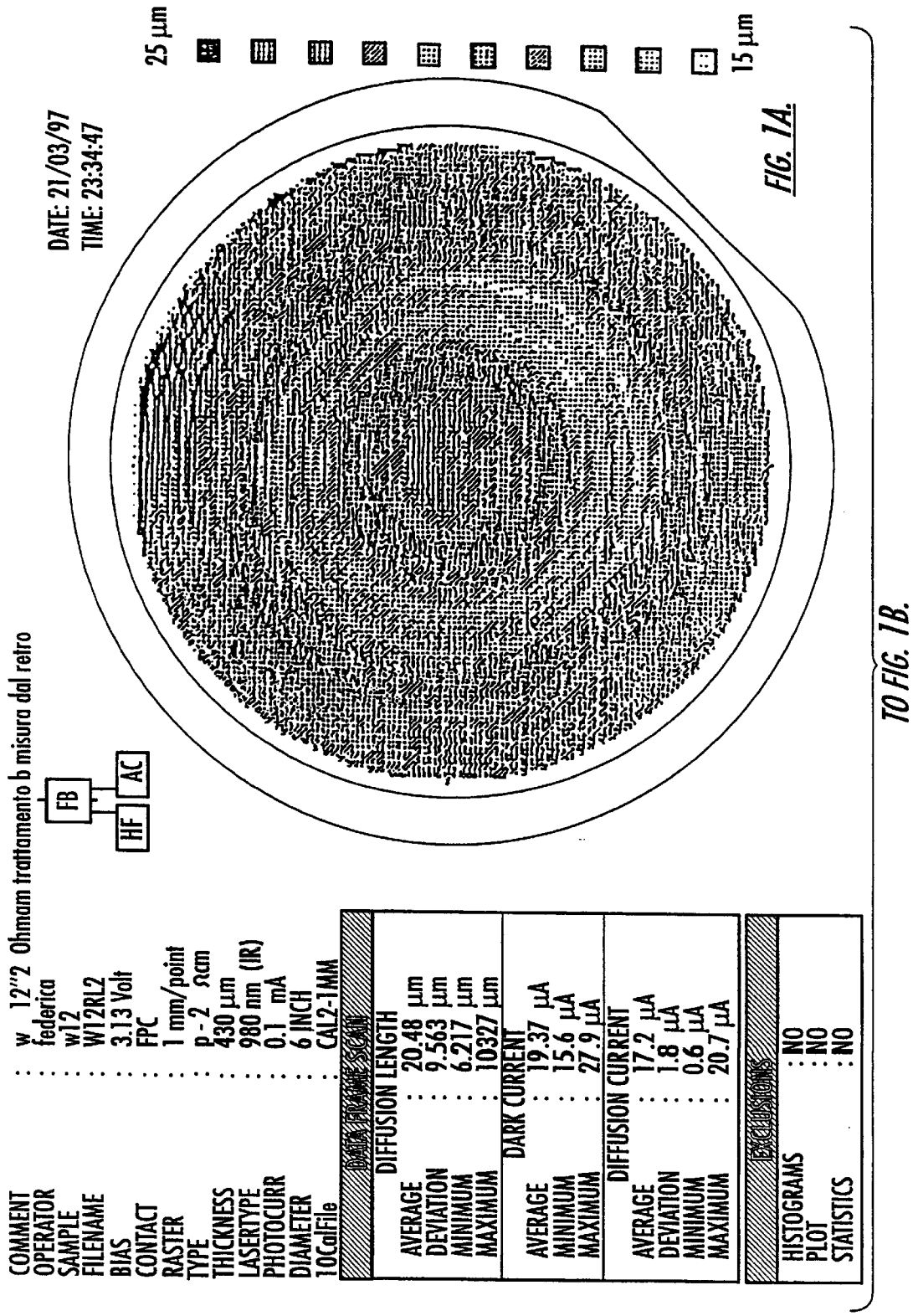

DETERMINATION OF THE THICKNESS OF A DENUDED ZONE IN A SILICON WAFER

FIELD OF THE INVENTION

The present invention relates to fabrication processes of integrated circuits, and, more particularly, to methods for controlling the quality of monocrystalline silicon substrates.

BACKGROUND OF THE INVENTION

The silicon generally used for fabricating integrated circuits is grown using a technique referred to as the Czochralski (CZ) technique, and, therefore, contains oxygen in a concentration comprised generally between 5 and $10 \times 10^{17}$ atoms·cm$^{-3}$ (ASTM 83 units) as disclosed, for example, in A. Borghesi, B. Pivac, A. Sassella and A. Stella, Appl. Phys. Rev. 77, 4169 (1995) and W. Zuhlener, J. of Crystal Growth 65, 189 (1983). A substantially oxygen-free silicon monocrystal may be grown by other techniques such as the so-called "flow-zone" technique, but an oxygen-free silicon is unsuitable for fabricating integrated circuits because the presence of oxygen improves its mechanical properties, as disclosed, for example, in K. Sumino, Proc. of Semiconductor Silicon, 1981, The Electrochem. Soc., 1981.

On the other hand, the presence of oxygen may generate defects in the crystalline structure of silicon unless great care is exercised in exposing the substrate to particularly critical conditions during the fabricating process of integrated circuits. Indeed, in CZ silicon, oxygen may be over-saturated at particularly elevated process temperatures and precipitate during thermal treatments, as disclosed, for example, in J. G. Wikes, J. of Crystal Growth 65, 189 (1983).

Oxygen precipitation induces the formation of extensive defects (dislocations, stacking faults) and may degrade the performance of integrated circuits if these defects occur in the active areas of the devices. In contrast, if the defects induced by oxygen precipitation grow sufficiently far from the active areas of the devices, for instance deep into the bulk of the monocrystalline wafer, they tend to have a positive effect as they act as gathering centers of metal impurities (atoms of transition metals of the periodic table), as disclosed, for example, in W. K. Tice and T. Y. Tan, Appl. Phys. Lett. 28, 564 (1976). For these reasons, treatment techniques have been developed for obtaining silicon wafers where defects induced by oxygen precipitation exist only in an innermost region (bulk) with respect to the wafer thickness, and have an oxygen defect-free superficial layer (denuded zone) as disclosed, for example, in K. Nagasawa, Y. Matsushita and S. Kishino, Appl. Phys. Lett. 37, 622 (1980). Wafers so processed are then used for fabricating integrated devices essentially in the defect-free surface region also referred to as the "denuded-zone" of one of the two sides of the wafer of monocrystalline silicon.

The thickness of the denuded zone depends on the properties of the starting material, on the denuding pre-treatment and/or, in many cases, on the thermal treatments that are contemplated in the specific fabrication process of the integrated devices. Accordingly, it becomes necessary to monitor the actual thickness of the denuded zone to ensure that the active regions are reliably defined in defect-free regions on the silicon wafer.

Moreover, it has been recognized that oxygen precipitation in the bulk region should be moderate to be beneficial, as disclosed, for example, in R. Falster, 6th International Symposium on the Structure and Properties of Disclocations in Semiconductors, Oxford, 1989 and J. Vanhellemont and C. Claeys, Proc. of ESSDERC 87, G. Soncini and P. U. Calzolari, eds., North Holland, Amsterdam, 1988, p. 451. Thus, the density and size of oxygen precipitates in the bulk of a wafer should be relatively small, and the current techniques used to measure the thickness of denuded zones often fail under conditions of insufficient oxygen precipitate density in the bulk region.

Denuded zone thicknesses are commonly measured by means of microscopy techniques. The monocrystal cleavage, the selective etching and inspections of the samples by a suitable microscopy technique (optical microscopy, scanning electron microscopy (SEM), atomic force microscopy or others) are limited by an insufficient selectivity of the etching of the sample surface.

Transmission Electron Microscopy (TEM) does not require a selective etching of the samples and possesses a very high sensitivity, though it is statistically limited. Indeed, TEM may provide for a relatively correct estimate of the depth of the denuded zone only when the defect density in the bulk region is sufficiently large. This is so because of the restricted region of a sample that may be explored with this technique.

As mentioned above, the density and size of defects in the bulk of the wafer of monocrystalline silicon tend, for other reasons, to be particularly small in present wafers. As a consequence, the monitoring of the depth of the denuded zone by the known techniques becomes problematic. Moreover, these methods are destructive and require proper sample preparation which is a burdensome operation, especially for TEM exploration. For these reasons, reliably producing depth maps of denuded zones is at present difficult and costly.

In theory, the monitoring of the denuded zone thickness could be performed, by electrical methods, under favorable conditions. Probably, the most reliable of these techniques is the so-called Electron Beam Induced Current (EBIC) method. This method is very sensitive, but time consuming. In addition, it requires laborious sample preparation. In any case, it remains a destructive technique. Therefore, the EBIC technique remains unsuitable as an effective monitoring technique and for producing maps of the depth of a denuded zone in terms of compatibility of the time required and of the costs to implement a reliable process quality control.

On the other hand, it is well known that lifetime measurements of current carriers in a semiconducting silicon monocrystal are very sensitive to the presence of defects in the crystal lattice of the semiconductor, and, hence, to the presence of oxygen precipitates in the silicon. This is so especially if the lifetime measurements are carried out under conditions of low injection of electric charges.

According to a technique and relative measuring equipment, known in the trade with the name of Elymat, as described in V. Lehmann, H. Föll,J. Electrochem Soc. 135, 2831 (1988), excess minority carriers are generated by a laser beam that illuminates the front of a wafer. These carriers are collected in the space charge region of a Schottky contact which may be established either on the wafer back-side (backside photocurrent or BPC) or on the same illuminated or frontside of the wafer (frontside photocurrent or FPC).

The sample is dipped in a diluted HF solution to establish a Schottky contact on one side of the wafer and passivate the surface layer states on the other side. The injection level $\delta n/p_\circ$ (where $\delta n$ is the concentration of excess minority carriers and $p_\circ$ is the equilibrium concentration of minority carriers) can be varied by varying the power of the illuminating laser. Carrier lifetime ($\tau$) or diffusion length ($L_{diff}=\sqrt{D\tau}$, where D is the minority carriers diffusivity)

data are extracted from photocurrent measurements. FPC measurements are used when the lifetime in the sample under consideration is so low that practically no current could be gathered at a contact established on the backside of the wafer. This is often the case in the presence of oxygen precipitates, and thus FPC measurements are more suited than BPC measurements in view of the objective of the present invention.

A particularly sensitive method for measuring the lifetime under low injection conditions is the so-called method of Surface Photovoltage Measurement (SPV). Surface photovoltage measurements are carried out by illuminating the sample with lights of different wavelengths. The minority carriers generated are collected in a depletion region on the same wafer surface (at a certain distance from the illuminated area) and produce a variation of the surface potential. The variation in the surface potential is recorded as a function of the wavelength of the illuminating light, and, therefore, as a function of the penetration depth of the radiation in the semiconductor crystal.

At present there exist methods of surface photovoltage measurement that are particularly fast and do not require sample preparation. These methods of lifetime measurement by surface photovoltage measurements are intrinsically rapid and do not require costly sample preparation, and, therefore, have been indicated as potentially suitable to provide more or less reliable and approximate estimates of the depth of a defect-free superficial layer where it exists.

The method of surface photovoltage measurements, that is, of carrier lifetime measurements, has been proposed as a way to assess the depth of a defect-free superficial layer of a wafer of semiconducting monocrystalline silicon when the density of the defects induced by oxygen precipitates in the bulk of the silicon is sufficiently high as disclosed, for example, in L. Jastrzebski, Mat. Sci. Eng. B4, 113 (1989). This technique has been found unsuitable to provide for reliable estimates of the depth of the denuded zone in the case of wafers generally used at present that are characterized by having a relatively low density of oxygen precipitates in their bulk region.

SUMMARY OF THE INVENTION

Faced with these difficulties and limitations of prior art methods, there has now been found a simple and effective nondestructive method for determining the depth of a denuded zone of a wafer of semiconducting monocrystal. The method produces reliable measurements of the depth of a denuded zone even in the presence of relatively small densities and sizes of oxygen precipitates in the bulk region, such as would make impractical the electrical methods known at present.

The nondestructive method of the invention includes the steps of: stripping off by mechanical lapping and/or by wet or dry etching the denuded layer of the semiconductor wafer from at least a portion of the surface, preferably from the backside (where it can be removed from the whole surface) or from a certain area of the frontside of the wafer; measuring a surface photovoltage signal as a function of the injection depth of charge carriers "injected" by a photoelectric effect or by an equivalent injection method in a certain area of the wafer surface, on a portion of surface having such denuded layer and on a portion stripped of the denuded layer; and solving through a nonlinear "best-fit" procedure based on the measured values of the surface photovoltage signal function and using as a fitting parameter the thickness of the denuded zone or layer, or through equivalent numerical methods of the diffusion equation of charge carriers injected in the two distinct portions of surface.

Although any technique for measuring the diffusion length or lifetime of charge carriers, suitable for low injection level may be satisfactorily utilized, preferably the lifetime measurements of excess minority carriers injected in a defined semiconductor zone, are performed by surface photovoltage methods. While a "best-fit" technique with an analytical function obtained by solving the charge carrier diffusion equation is a relatively simple procedure, it will be readily appreciated that modern numerical processing will yield comparable or even better results.

DETAILED DESCRIPTION OF THE PREFERRED EMBODIMENTS

The method of the invention and comparison with different measuring techniques and relative results are provided below. These tests were carried out using a commercial apparatus for surface photovoltage measurements manufactured by the company SDI, model CSM III-A SPV. This instrument is equipped with a set of filters that produce monochromatic light of seven different wavelengths, ranging from 800 nm to 1 mm. The corresponding light penetration depths in a silicon crystal range approximately between 11 $\mu$m and 157 $\mu$m.

Since the intrinsic lifetime measurements may only give indirect estimates of the depth of an eventual denuded zone of a wafer, that is, of a substantially defect-free superficial layer of the wafer, the results obtained with the method of the invention were compared with direct observations carried out on the same samples by conventional destructive methods, based on microscopic observation techniques, to have a measure of the degree of reliability of the indirect data obtained by the method of the invention. Hence, after performing lifetime measurements on sample wafers, the wafers were cut, cleaved, selectively etched with an etchant solution known in the trade as "Secco d'Aragona" and finally inspected by a Scanning Electron Microscope (SEM) or by an Atomic Force Microscope (AFM). The same samples were also inspected by Transmission Electron Microscopy (TEM).

According to an essential aspect of the method of the invention, the denuded zone was removed completely from the backside of the sample wafers. This was done by lapping. The resulting damage caused by lapping was eliminated by etching the silicon for removing the highly stressed layer left by the lapping process.

The total thickness stripped off was about 150 μm. This depth is sure to be greater than the expected depth of a denuded zone of a wafer treated for this purpose.

After having stripped off the denuded zone from the backside of the silicon wafer, lifetime measurements were carried out for comparison purposes via photocurrent measurements on the backside of sample wafers, using FPC Elymat equipment. The resulting diffusion length of minority carriers was found to be much smaller than the thickness of the bulk region of the wafer containing oxygen precipitate defects so that this diffusion length provided a measure of the recombination efficiency in a defective region of silicon.

Figure 1B:
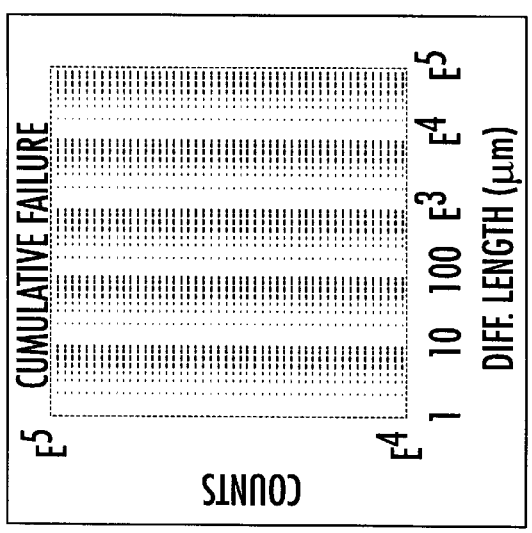
FIG. 1, as already mentioned, shows a typical map and relevant characteristics and values of the diffusion length of minority carriers as normally obtained with an Elymat apparatus.
Figure 1B:
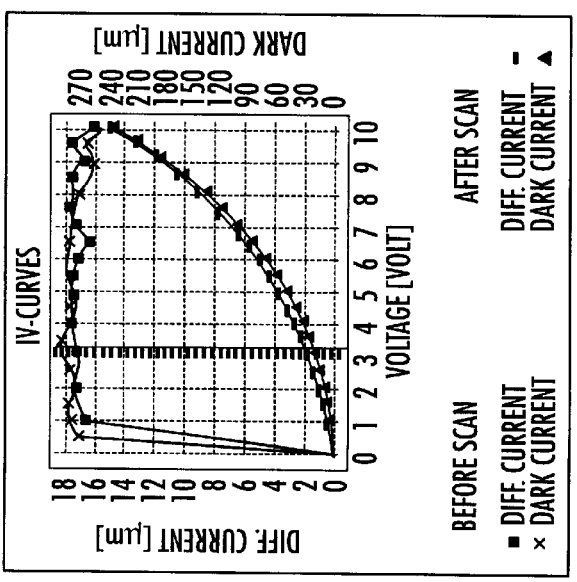
Figure 1B:
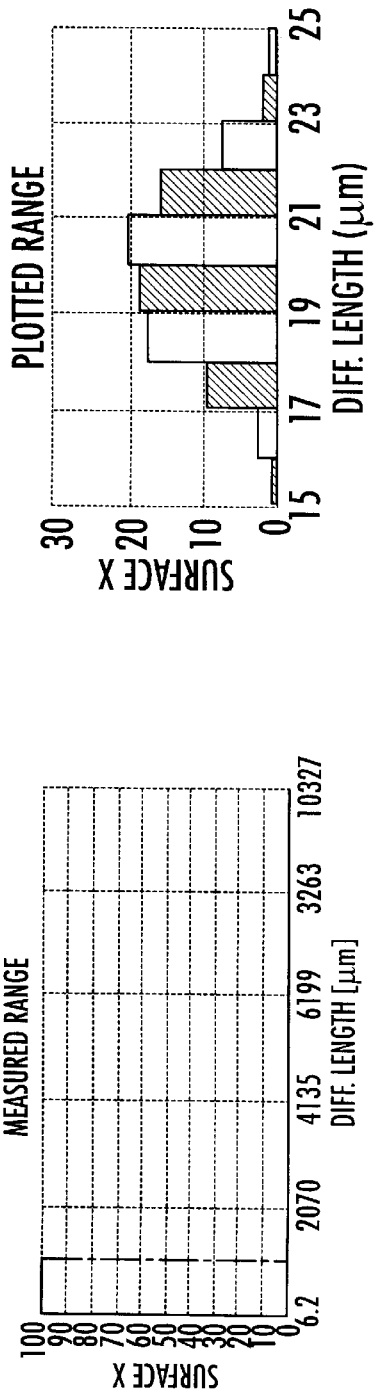

FIG. 1 shows a typical map of minority carrier diffusion lengths obtained by an FPC Elymat technique in the bulk region of the silicon wafer containing oxygen precipitates. The concentric ring aspect of the map reflecting the crystal growth conditions is immediately recognized by those familiar with the Elymat technique and instrumentation and represents a "marker" of oxygen precipitation. The measurements of the charge carrier lifetime were analyzed as a function of the injection level for some of the most common contaminants of the silicon to identify with certainty the dominant recombination center.

Figure 2:
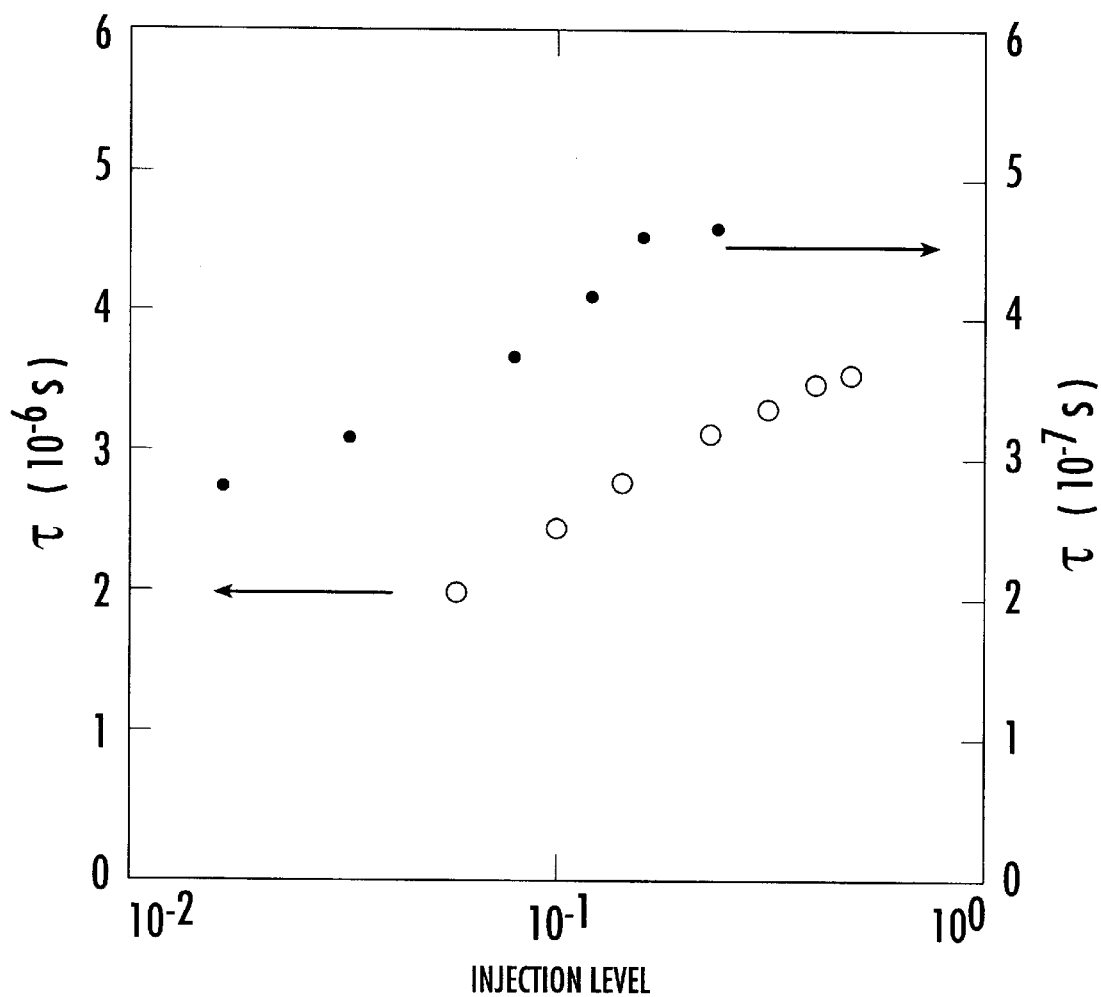
FIG. 2 shows the dependence on the level of injection of the mean value of minority carriers lifetime.

FIG. 2 shows the measured lifetime which differed by about one order of magnitude among the samples. However, the same dependence of the lifetime on the injection level $\delta n/p_\circ$ was verified in all the samples. This kind of behavior was always observed in association with a map of concentric rings as the one shown in FIG. 1. Therefore, the dominant recombination center could be identified in oxygen precipitation sites. These tests demonstrate that the recombination efficiency of oxygen precipitates is higher for a lower level of injection.

Figure 3:
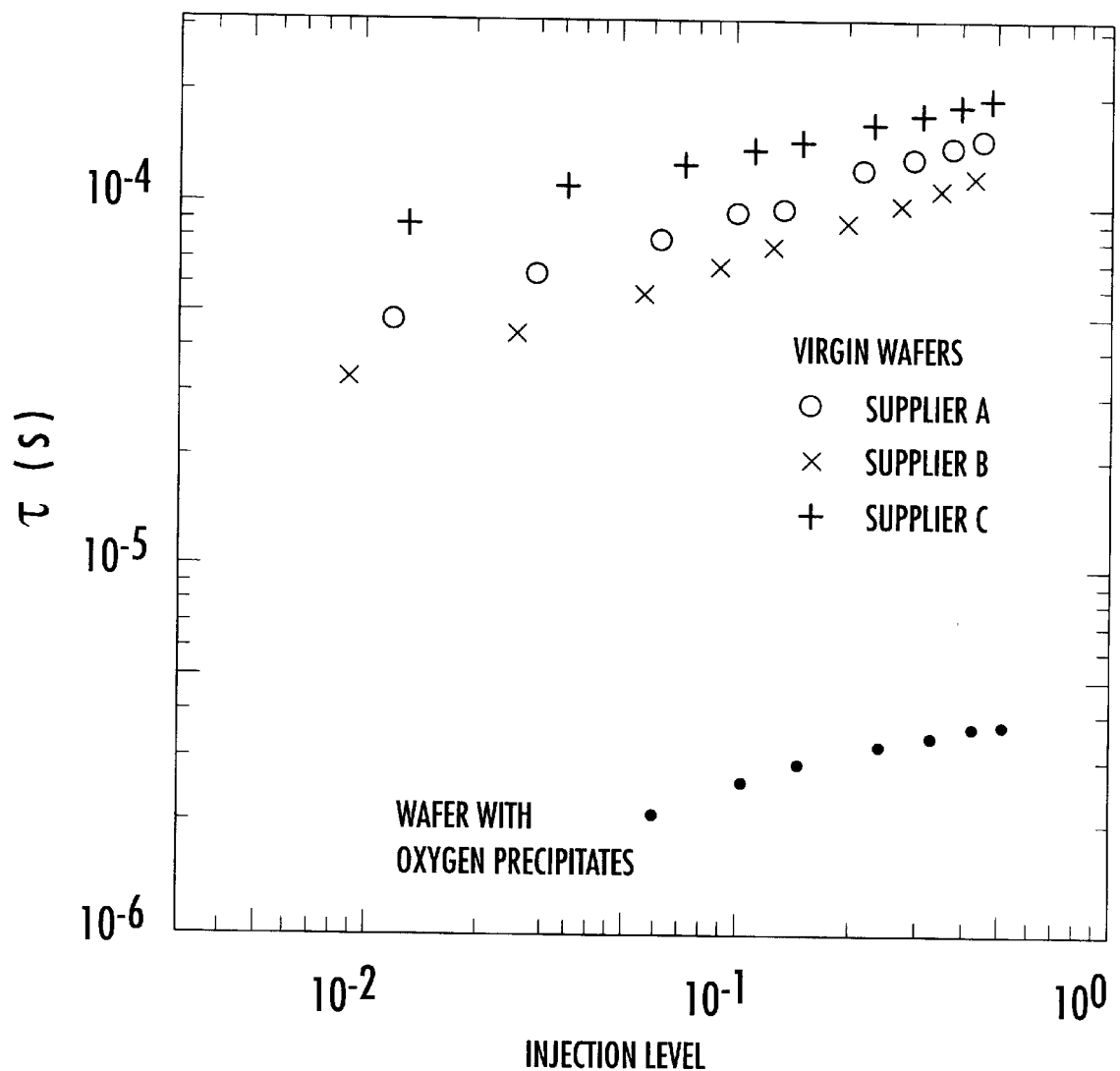
FIG. 3 shows the influence of oxygen precipitates on measured minority carrier lifetime.

As shown in FIG. 3, similar lifetime dependence on the injection level was also observed in virgin CZ silicon wafers, that is, in wafers that were not treated to produce denuded zones thereon, and coming from three different suppliers. In silicon monocrystals obtained with the CZ method, nuclei of oxygen precipitates tend to form during ingot cooling and during the heat treatment for deactivating thermal donors. Accordingly, it is not unlikely that the oxygen precipitation sites are the dominant recombination centers that exist in the starting material, in which contamination by transition metals may be very low (on the order of $10^{10}$ atoms·cm$^{-3}$) This may be detected by SPV measurements using the optical separation of the iron-boron pair.

Therefore, lifetime measurements as a function of the injection level, in conjunction with lifetime maps, confirm the hypothesis that oxygen precipitates represented, at least in the examined samples, the dominant recombination center. Moreover, the SPV technique is intrinsically suited under conditions of low level injection, and from the confirming results obtained from Elymat tests, this technique confirms itself as being extremely sensitive to oxygen precipitation.

According to a standard processing of SPV measurement data, a uniform distribution of the recombination centers is assumed. In wafers having a superficial denuded zone, an SPV data processing is capable of producing an estimate of the effective diffusion length $L_f$, resulting from an average between the diffusion length in the denuded zone and the diffusion length in the underlying defective bulk region.

According to an essential aspect of the method of the invention the processing of SPV measurement data on a portion of the surface of a wafer having a denuded zone and an internal or bulk region of where there exist oxygen precipitates and associated defects, the SPV signal data must be processed by considering the sample in homogeneous as a function of depth. This can be done in different ways, for instance, one such way is through a numerical solution of the equations that govern the evolution of the charge carriers concentration in the semiconductor. There exist computer programs that are specifically suited for this purpose which are capable of accounting for the dependence of defects concentration from the depth. The most elementary approach includes assuming that regions exist wherein:

$$L_{diff} = \begin{cases} L_{DZ} & \text{if } x \leq t_{DZ} \\ L_{def} & \text{if } x > t_{DZ} \end{cases} \quad (1)$$

wherein $L_{diff}$ is the diffusion length of minority carriers, $L_{DZ}$ is the diffusion length of minority carriers for a recombination center density of the denuded zone, $L_{def}$ is the diffusion length of minority carriers in the defective bulk region ($L_{DZ} \gg L_{def}$), x is the depth coordinate, and $t_{DZ}$ is the thickness of the denuded zone (DZ).

According to the method of the invention, a direct measurement of $L_{def}$ is obtained by performing the measurements on the backside of the wafer or on the portion of the surface of the wafer where the DZ layer has been purposely stripped off. This is done by measuring the diffusion length of minority carrier in the defective bulk region.

In all the tested samples, the measurements taken on the defective bulk region gave lower diffusion lengths than those conducted on the frontside of the wafer, thereby confirming the presence of a relatively defect-free denuded zone on the frontside of the wafer. In contrast, no difference between respective diffusion length measurements was found in wafers with a uniform distribution of recombination centers, such as, for example, on samples purposely contaminated with iron.

Figure 4:
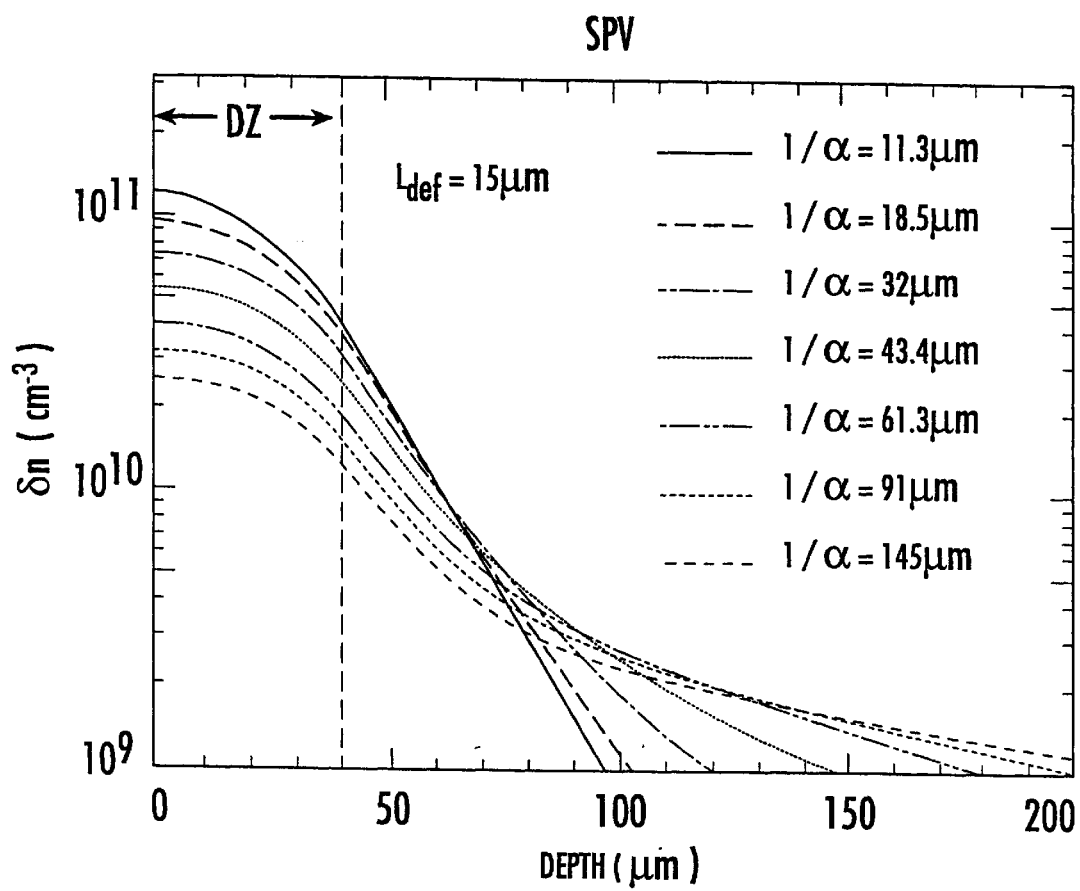
FIG. 4 shows the distribution profiles of excess minority charge carriers as a function of depth in a wafer with a denuded zone, obtained using superficial photovoltage measurements.

A quantitative evaluation of the depth of the denuded zone is obtained by solving the diffusion equation of minority charge carriers, while imposing the above stated conditions from equations (1) and continuity of the density function n(x) of the minority carriers and of its first derivative, at the boundary $x=t_{DZ}$ for x equal to $t_{DZ}$. The profiles of the n(x) function are depicted in the diagram of FIG. 4 for the reported testing conditions, namely: $t_{DZ}$=40 μm, $L_{def}$=15 μm, penetration depth of incident light from 11 to 157 μm.

The $L_{DZ}$ value is relatively constant as long as the condition $L_{DZ} \gg L_{def}$ is met and in the calculations the value $L_{DZ}$=400 μm was used. As in a normal SPV technique, the variation of the surface potential signal upon illumination is assumed to be proportional to the concentration of excess minority carriers at the surface, that is, correspondent to the function $V_{ph} \propto n(x=0)$. This quantity has then been written as a function of the penetration depth z of the particular light being used, with $t_{DZ}$, $L_{def}$ and $L_{DZ}$ as parameters.

Since, according to the method of the invention, $L_{def}$ is directly measured and $L_{DZ}$ is made relatively constant by assuming $L_{DZ} \gg L_{def}$, the diffusion function $V_{ph}(z)$ has only one parameter to be fit, that is, the depth $t_{DZ}$ of the denuded zone DZ. By a best-fit procedure of this function, from SPV experimental data, an excellent estimate of the depth (thickness) of the denuded zone is obtained.

Figure 5:
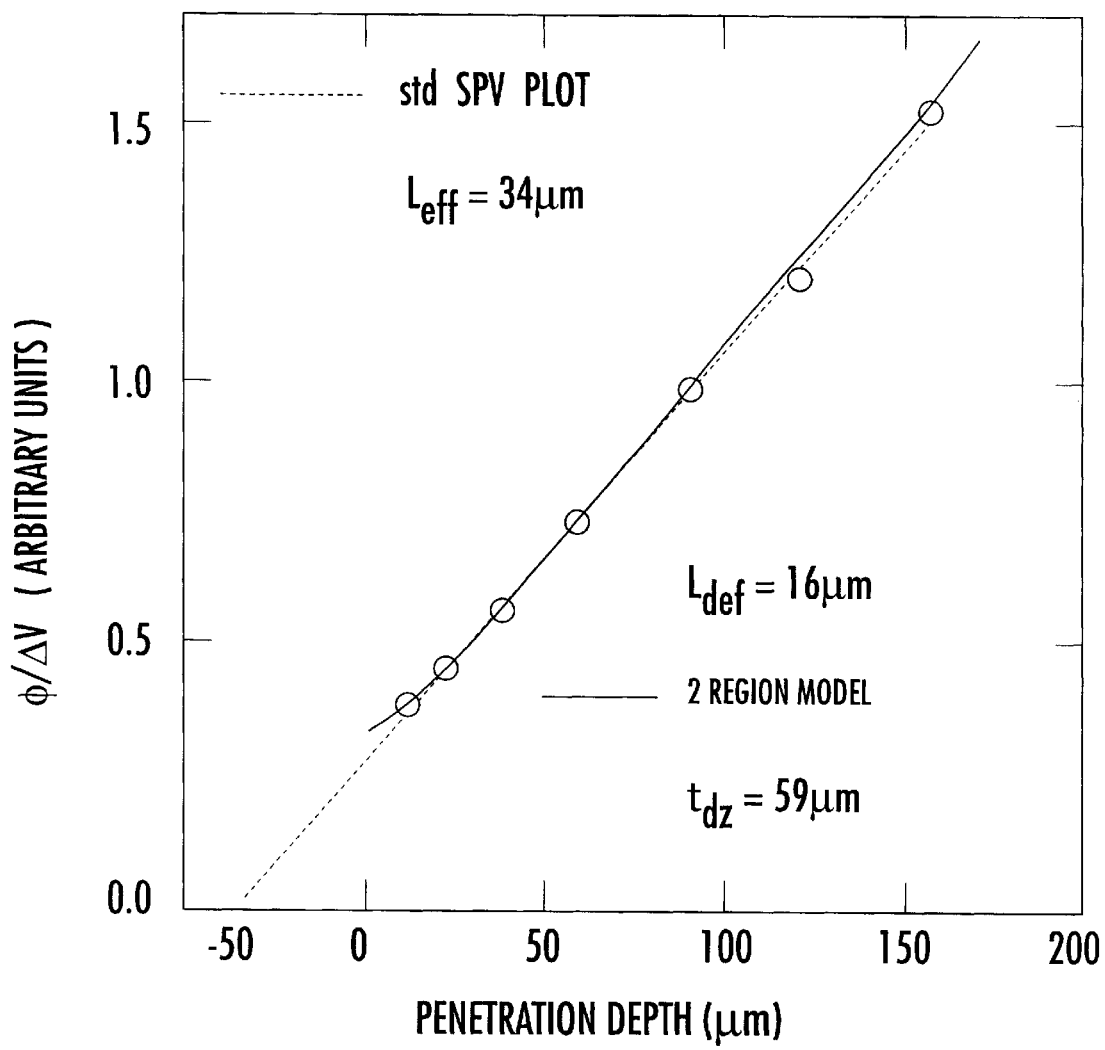
FIG. 5 shows the surprising coincidence with the real pattern of the SPV signal as a function of the penetration depth of the incident light and the data best-fit with the function calculated based on the diffusion equation for a region including both the bulk and the denuded zone.

FIG. 5 shows the processing results, according to the method of the invention, relative to the case of a sample wafer for which an effective diffusion length of 34 μm ($L_{eff}$=34 μm) was measured on the frontside and a diffusion length of 16 μm ($L_{def}$=16 μm) was measured on the backside of the wafer from where the denuded zone had been previously stripped off. The depth $t_{DZ}$ of the denuded zone present on the frontside of the wafer calculated according to the method of the invention was 59 µm.

As it may be observed from the distribution of the values measured on the wafer frontside ($L_{eff}$) and on the wafer backside ($L_{def}$), the sample shows a marked in homogeneity as a function of depth from the surface. Despite of this relatively large nonuniformity, the curve of the SPV measurements (conventionally φ/SV as a function of 1/α where φ is the incident flux and a is the absorption coefficient) appears substantially linear and this was surprisingly observed in all the samples with a denuded zone. This linearity of the curves obtained through SPV measurements at different wavelengths reveals the lack of reliability in assuming that such a linearity could be indicative of uniformity. The reason for such a scarce correlation between the two aspects may be understood by observing the minority carrier density profiles shown in FIG. 4.

As may be observed, for all the wavelengths of the exciting light, the excess minority carriers profiles extend over a significantly larger depth than that of the denuded zone. Therefore, for all the different penetration depths of the monochromatic lights used, the resulting photovoltage signal derives from an average among the characteristics of density of recombination centers of the denuded layer DZ and of the underlying defective bulk region. Evidently, it cannot be assumed that the photovoltage signal is dominated by the properties of only one of the two distinct regions.

To fully test the method of the invention, experiments were undertaken on three different sample populations of silicon wafers, subjected and not subjected to a preventive denuding treatment, and for the case of different fabrication processes, naming the three different test sample populations with the letters: a), b) and c), as shown in the following table 1:

TABLE 1

| LO–HI Process (a) No denuding treatment High temperature diffusion | Process (b) Denuding treatment High temperature diffusion | Process (c) Denuding treatment No further High temp. diffusion |
| --- | --- | --- |
| ◆ 800° C., 1 h, wet O₂ + 775° C., 1 h 50 min, N₂<br>◆ 1175° C., 2 h 40 min, N₂/O₂<br>◆ 1100° C.; 1 h 40 min, N₂/O₂<br>◆ 800° C., 1 h, wet O₂ + 775° C., h 50 min<br>◆ 920° C., 6 h wet O₂ + 1 h N₂ | ◆ 1100° C., 4 h, N₂/O₂<br>◆ 800° C., 1 h, wet O₂ + 775° C., 1 h 50 min, N₂<br>◆ 1175° C., 2 h 40 min, N₂/O₂<br>◆ 1100° C.; 1 h 40 min, N₂/O₂<br>◆ 800° C., 45 min, wet O₂<br>◆ 620° C., 1 h 45 min, N₂<br>◆ 775° C., 2 h 15 min, N₂<br>◆ 920° C., 6 h wet O₂ + 1 h N₂ | ◆ 1100° C., 4 h, N₂/O₂<br>◆ 800° C., 45 min, wet O₂<br>◆ 620° C., 1 h 45 min, N₂<br>◆ 775° C., 2 h 30 min, N₂<br>◆ 920° C., 6 h wet O₂ + 1 h N₂ |

The results of the measurements at the edge and at the center of the sample wafers, the semiconductor resistivity, the effective diffusion length ($L_{def}$) measured on the wafers backside after stripping off said surface a thickness of material sufficient to ensure a complete removal of any existing denuded layer, the effective diffusion length ($L_{eff}$), measured on the frontside of the wafers are shown in table 2, along with the estimated values of the depth of the denuded zone.

TABLE 2

| ρ | | $L_{def}$ (µm) | | $L_{eff}$ (µm) | | $t_{dz}$ (µm) | |
| --- | --- | --- | --- | --- | --- | --- | --- |
| (Ωcm) | Process | Edge | Center | Edge | Center | Edge | Center |
| 2 | a | 15 | 15.6 | 28.3 | 33.3 | 49.3 | 58.7 |
| 10 | a | 11.5 | 8.2 | 13.1 | 12.0 | 15.3 | 19.9 |
| 10 | a | 13.2 | 11.2 | 15.9 | 13.0 | 18.9 | 14.6 |
| 10 | a | 5.15 | 7.32 | 18.9 | 23.0 | 43.2 | 49.3 |
| 2 | b | 8.61 | 7.43 | 29.4 | 26.5 | 61.7 | 57.1 |
| 2 | b | 26.8 | 33.6 | 50.1 | 51.7 | 78.4 | 81.8 |
| 2 | b | 9.67 | 7.75 | 29.3 | 26.5 | 62.9 | 56.9 |
| 2 | b | 5.83 | 6.66 | 27.5 | 27.1 | 61.6 | 59.7 |
| 10 | b | 21.5 | 18.8 | 35.7 | 37.7 | 56.6 | 65.4 |
| 10 | b | 18.4 | 16.5 | 34.1 | 34.6 | 60.0 | 62.1 |
| 10 | b | 20.3 | 18.7 | 35.9 | 34.8 | 59 | 59.3 |
| 2 | c | 21.7 | 22.6 | 25.2 | 24.1 | 24.9 | 17.8 |
| 2 | c | 2.62 | 2.84 | 12.7 | 12.9 | 32.2 | 32.5 |
| 2 | c | 21.7 | 22.5 | 26.1 | 23.3 | 27.7 | 14.7 |
| 2 | c | 1.69 | 3.41 | 11.8 | 12.9 | 31.2 | 31.6 |
| 10 | c | 15.2 | 16.3 | 18.0 | 18.4 | 20.1 | 18.1 |
| 10 | c | 12.8 | 12.8 | 16.2 | 15.9 | 20.9 | 19.6 |
| 10 | c | 15.9 | 13.7 | 17.4 | 16.5 | 15.7 | 19.4 |

The results obtained were in excellent accordance with microscopic observations that were successively carried out on the sample wafers. This demonstrated that the method of the invention for estimating the thickness of the denuded zone is outstandingly reliable.

The nondestructive character of the SPV technique, in conjunction with the relative ease with which the denuded zone may be stripped off, for example, from the entire backside of the wafer by lapping and/or etching, makes the method of the invention suitable for implementing an effective and relatively low cost quality control of the fabrication process, with important beneficial repercussions on the yield.

As already mentioned, the estimation method of the invention, may also make use of measuring techniques of lifetime or diffusion length of minority charge carriers different from the SPV techniques, as long as equally effective as the SPV technique, under conditions of a low injection level. For example, the so-called microPCD (microwave-detected Photoconductive Decay technique, as described, for example, in J. W. Orton and P. Blood, "The Electrical Characterization of semiconductors: Measurements of minority carrier properties", Academic Press, London, 1990), a technique effective under conditions of low injection as disclosed in M. Kunst and G. Beck, 60, 3558 (1986), may be viable alternative to the SPV technique. There are other techniques similar to micro-PCD techniques, that measure the density of excess minority carriers as a function of time based on sample absorption in the infrared, such as disclosed in G. S. Kousik, Z. G. Ling and P. K. Ajmera, J. Appl. Phys, 71, 141 (1992).

That which is claimed is:

1. A nondestructive method for estimating a thickness of a denuded superficial layer with respect to a relatively defective bulk region of a monocrystalline semiconductor wafer, the method comprising the steps of:

stripping off the denuded superficial layer from at least a first portion of the wafer;

separately measuring a minority carrier lifetime in the first portion of the wafer, and a surface photovoltage signal as a function of a light penetration depth in a second portion of the wafer having the denuded layer thereon, while injecting minority charge carriers at a low level for a depth sufficient to encompass both the denuded superficial layer and at least a portion of the bulk region; and calculating the thickness of the denuded layer as the depth required to account for the measured minority carrier lifetime and for the measured surface photovoltage signal versus the light penetration depth.

2. A method according to claim 1, wherein the step of calculating comprises calculating using a best-fit procedure.

3. A method according to claim 1, wherein the step of calculating comprises calculating using numerical processing.

4. A method according to claim 1, wherein the step of injecting comprises illuminating the wafer with monochromatic light.

5. A method according to claim 1, wherein the steps of measuring and injecting comprise performing a Surface Photovoltage Measurement (SPV) technique by illuminating an area of the wafer surface with monochromatic light.

6. A method according to claim 5, wherein the step of illuminating comprises illuminating with monochromatic light having a wavelength in a range of between about 800 nm and 1000 nm.

7. A method according to claim 5, wherein the step of calculating comprises expressing SPV measurement data as a function of a penetration depth of the monochromatic light and calculating the thickness by a best-fit procedure using as a fitting parameter a thickness of the denuded superficial layer.

8. A method according to claim 1, wherein the wafer has a front side for forming active devices therein and a backside; and wherein the step of stripping comprises stripping off the denuded layer from at least a first portion of the backside of the wafer.

9. A method according to claim 1, wherein the step of stripping comprises stripping off the denuded layer from the entire backside of the wafer.

10. A met hod according to claim 1, wherein the wafer has a front side for forming active devices therein; and wherein the step of stripping comprises stripping off at least a first portion of the denuded layer on the front side of the wafer.

11. A method according to claim 1, wherein the step of stripping comprises stripping by mechanical lapping.

12. A method according to claim 1, wherein the step of stripping comprises stripping by at least one of wet or dry etching.

13. A method for estimating a thickness of a denuded superficial layer with respect to a relatively defective bulk region of a monocrystalline semiconductor wafer, the method comprising the steps of:

stripping off the denuded superficial layer from at least a first portion of the wafer;

separately measuring a minority carrier lifetime in the first portion of the wafer, and a surface photovoltage signal as a function of a light penetration depth in a second portion of the wafer having the denuded layer thereon, while illuminating the wafer with monochromatic light to inject minority charge carriers at a low level for a depth sufficient to encompass both the denuded superficial layer and at least a portion of the bulk region; and calculating the thickness of the denuded layer as the depth required to account for the measured minority carrier lifetime and for the measured surface photovoltage signal versus the light penetration depth.

14. A method according to claim 13, wherein the step of calculating comprises calculating using a best-fit procedure.

15. A method according to claim 13, wherein the step of calculating comprises calculating using numerical processing.

16. A method according to claim 13, wherein the step of illuminating comprises illuminating with monochromatic light having a wavelength in a range of between about 800 nm and 1000 nm.

17. A method according to claim 13, wherein the steps of measuring and illuminating comprise performing a Surface Photovoltage Measurement (SPV) technique.

18. A method according to claim 17, wherein the step of calculating comprises expressing SPV measurement data as a function of a penetration depth of the monochromatic light and calculating the thickness by a best-fit procedure using as a fitting parameter a thickness of the denuded superficial layer.

19. A method according to claim 13, wherein the wafer has a front side for forming active devices therein and a backside; and wherein the step of stripping comprises stripping off the denuded layer from at least a first portion of the backside of the wafer.

20. A method according to claim 13, wherein the step of stripping comprises stripping off the denuded layer from the entire backside of the wafer.

21. A method according to claim 13, wherein the wafer has a front side for forming active devices therein; and wherein the step of stripping comprises stripping off at least a first portion of the denuded layer on the front side of the wafer.

22. A method according to claim 13, wherein the step of stripping comprises stripping by mechanical lapping.

23. A method according to claim 13, wherein the step of stripping comprises stripping by at least one of wet or dry etching.

* * * * *